(12) United States Patent
Campbell et al.

(10) Patent No.: US 6,360,133 B1
(45) Date of Patent: Mar. 19, 2002

(54) METHOD AND APPARATUS FOR AUTOMATIC ROUTING FOR REENTRANT PROCESS

(75) Inventors: William Jarrett Campbell; Anthony J. Toprac; Christopher A. Bone, all of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/335,405

(22) Filed: Jun. 17, 1999

(51) Int. Cl.[7] .............................................. G06F 19/00
(52) U.S. Cl. ....................................... 700/115; 700/121
(58) Field of Search ................................ 700/115, 117, 700/121

(56) References Cited

U.S. PATENT DOCUMENTS 5,216,613 A * 6/1993 Head, III ................. 369/275.5
5,528,510 A * 6/1996 Kraft .......................... 364/468
5,856,923 A * 1/1999 Jones et al. ............. 364/468.28
5,963,881 A * 10/1999 Kahn et al. .................... 702/35

* cited by examiner

Primary Examiner—Paul P. Gordon
(74) Attorney, Agent, or Firm—Williams, Morgan & Amerson, P.C.

(57) ABSTRACT

The present invention provides for a method and an apparatus for automatic routing of semiconductor devices within a manufacturing area. Performance of a plurality of manufacturing tools is tracked while processing semiconductor devices. At least one optimal combination of the manufacturing tools is determined based upon the tracked performance of the manufacturing tools. A queuing system is implemented to attain the optimal combination of the manufacturing tools. A dispatch system is deployed in response to the queuing system for routing the semiconductor devices within the manufacturing area.

31 Claims, 4 Drawing Sheets

METHOD AND APPARATUS FOR AUTOMATIC ROUTING FOR REENTRANT PROCESS

BACKGROUND OF THE INVENTION

1. Field of the Invention

This invention relates generally to semiconductor products manufacturing, and, more particularly, to a method and apparatus for automated routing of semiconductor devices through reentrant processes.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

One of the most important aspects of semiconductor manufacturing is overlay control. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. Often, semiconductor devices are staged through multiple manufacturing tools for multiple processes. Generally, a routing system within the APC framework transports semiconductor devices through a manufacturing area by searching for the next available manufacturing tool, which may not net the highest quality output.

The present invention is directed to overcoming, or at least reducing the effects of, one or more of the problems set forth above.

SUMMARY OF THE INVENTION

In one aspect of the present invention, a method is provided for automatic routing of semiconductor devices within a manufacturing area. Performance of a plurality of manufacturing tools is tracked while processing semiconductor devices. At least one optimal combination of the manufacturing tools is determined based upon the tracked performance of the manufacturing tools. A queuing system is implemented to attain the optimal combination of the manufacturing tools. A dispatch system is deployed in response to the queuing system for routing the semiconductor devices within the manufacturing area.

In another aspect of the present invention, an apparatus is provided for automatic routing of semiconductor devices within a manufacturing area. The apparatus of the present invention comprises: means for tracking performance of a plurality of manufacturing tools while processing semiconductor devices; means for determining at least one optimal combination of the manufacturing tools based upon the tracked performance of the manufacturing tools; means for implementing a queuing system to attain the optimal combination of the manufacturing tools; and means for deploying a dispatch system in response to the queuing system for routing the semiconductor devices within the manufacturing area.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

There are many discreet processes that are involved in semiconductor manufacturing. Many times, semiconductor devices are stepped through multiple manufacturing process tools. Some manufacturing process tool combinations produce more favorable results than other combinations. Overlay process is an important group of process steps in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of automatic routing of semiconductor devices in an order that results in improved quality. The present invention also teaches a method of integrating product ion data with a process controller and a semiconductor device routing system.

Figure 1:
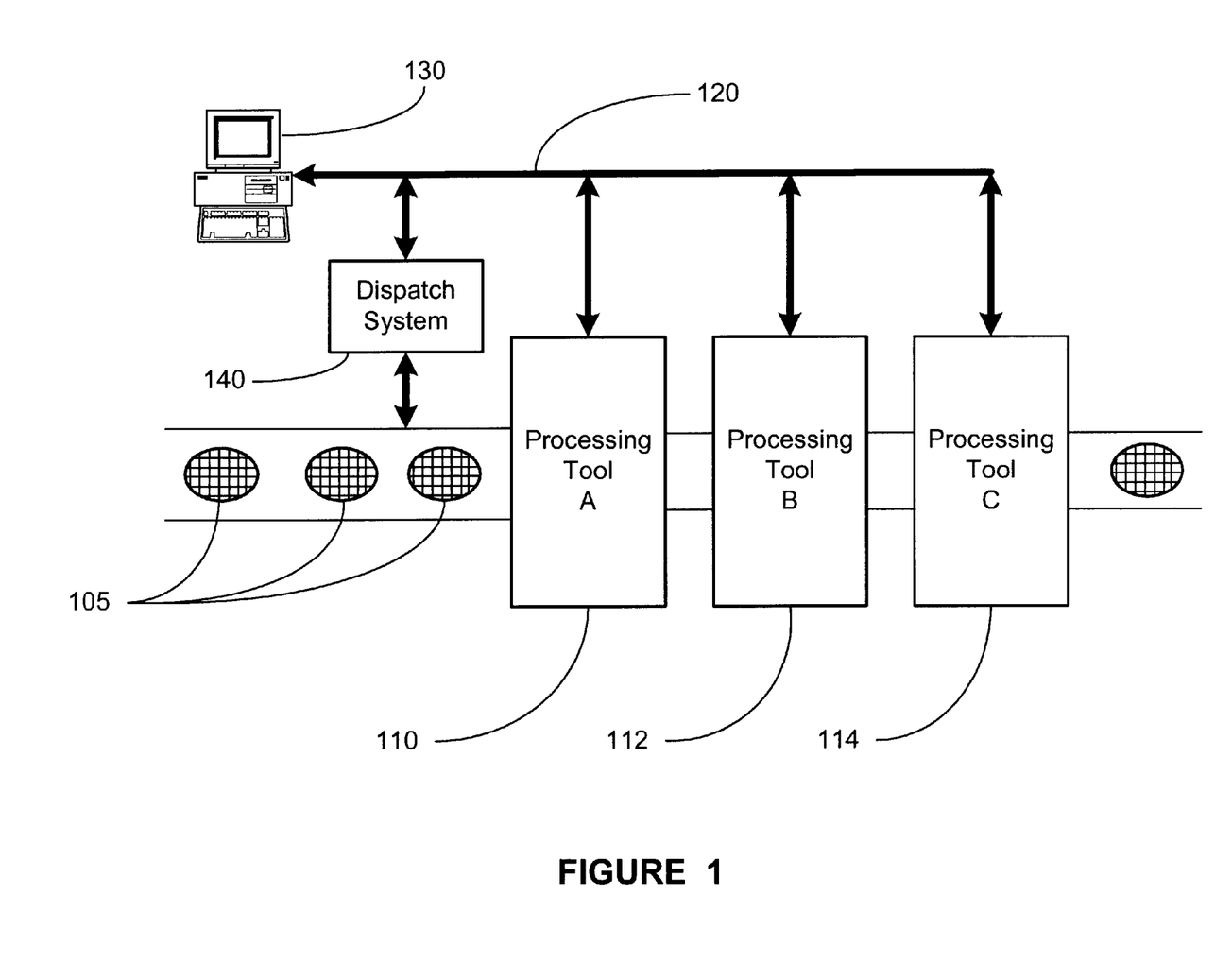
FIG. 1 illustrates one embodiment of the method taught by the present invention.

Turning now to FIG. 1, one embodiment of the present invention is illustrated. In one embodiment, semiconductor products 105, such as semiconductor wafers are processed on processing tools 110, 112, 114 using a plurality of control input signals on a line 120. In one embodiment, the control input signals on the line 120 are sent to the processing tools 110, 112, 114 from a computer system 130. Examples of the processing tools 110, 112, 114 used in semiconductor manufacturing processes are steppers.

The control inputs, on the line 120, that are used to operate the processing tools 110, 112, 114 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of selecting which processing tool (or manufacturing tool) combination (i.e., process a semiconductor device on processing tool A 110 and then on processing tool C 114, instead of processing tool B 112), on a run-to-run basis. In one embodiment a dispatch system 140 is used guide semiconductor products 105 through a predetermined order of processing tools 110, 112, 114.

When a process step in a processing tool 110, 112, 114 is concluded, the semiconductor product 105 or wafer that is being processed is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs for a particular exposure process. The control inputs generally affect the accuracy of the process steps performed by the processing tools 110, 112, 114 on the semiconductor wafer. Modifications of the control inputs can be utilized to improve the performance of the process steps employed in the manufacturing tool. Many times, the errors that are found in the processed semiconductor products 105 can be correlated to a particular order or combination of processing tools 110, 112, 114 used.

Figure 2:
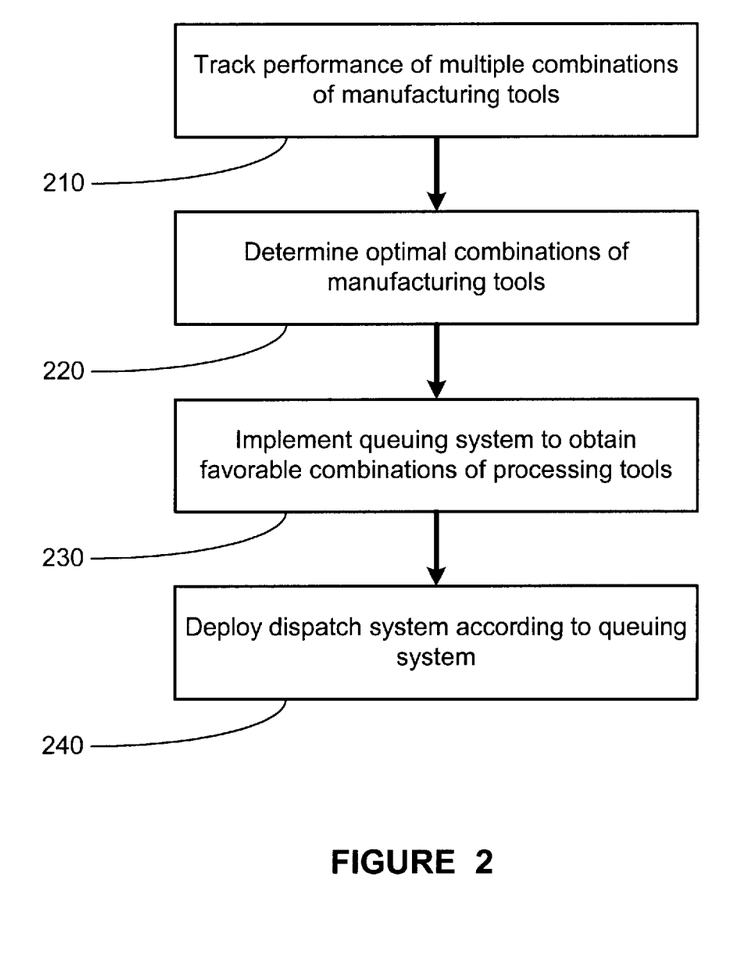
FIG. 2 illustrates a flowchart representation of the methods taught by the present invention.
Figure 3:
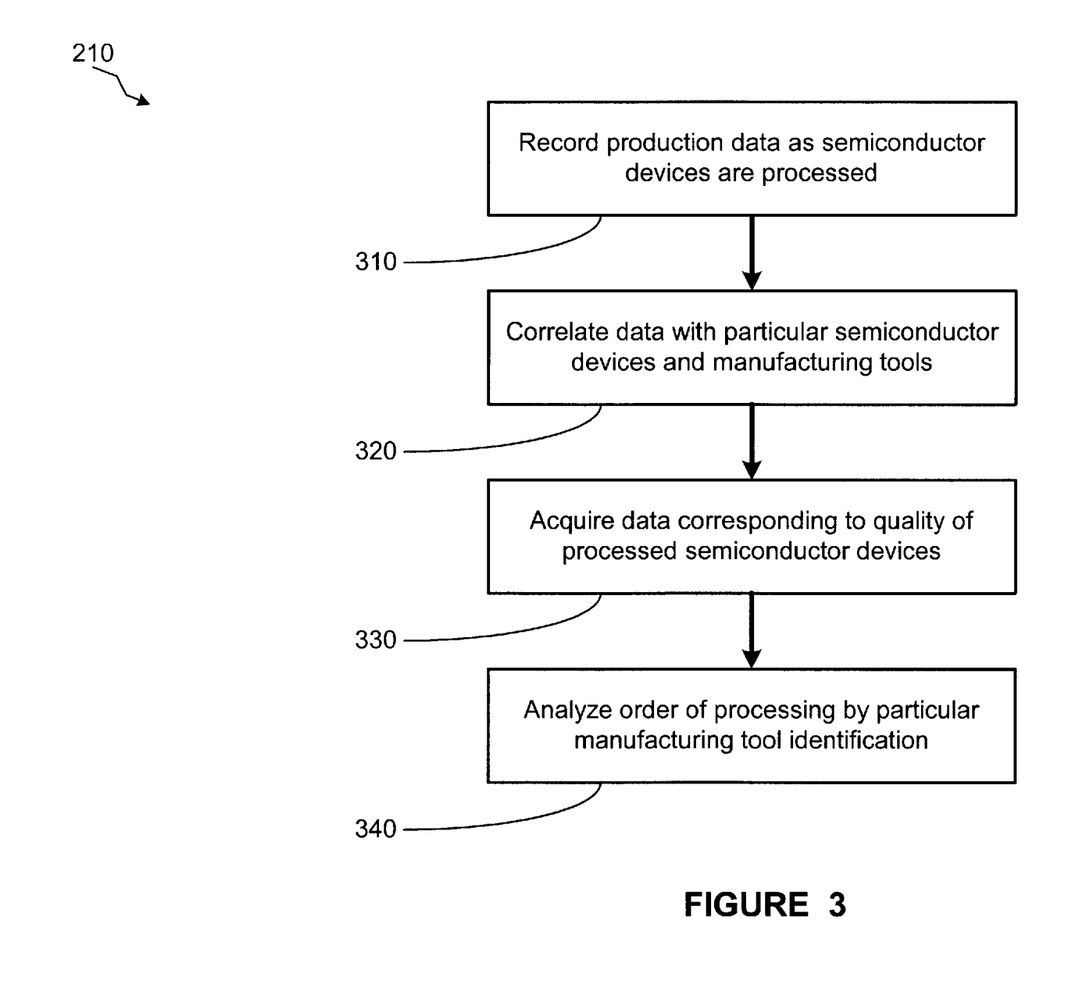
FIG. 3 depicts a more detailed illustration of the step of tracking quality data relating to manufacturing tool combinations described in FIG. 2.

Turning now to FIG. 2, a flowchart representation of one embodiment of the method taught by the present invention is illustrated. In one embodiment, performance of multiple combinations and orders of manufacturing tools are tracked, as described in block 210 of FIG. 2. FIG. 3 illustrates a flow chart representation of one embodiment of the method of tracking performance of manufacturing tools based upon different combinations and order of usage of the manufacturing tools.

Turning now to FIG. 3, in one embodiment, production data is recorded as semiconductor devices are being processed, as described in block 310 of FIG. 3. A process controller (not shown), such as the Advanced Process Controller (APC) can be used to record production data. In one embodiment, the production data is stored in an electronic medium such that an APC machine interface (not shown) is capable of recovering and sorting the production data. For photolithography overlay processes, data, such as misregistration between different layers of the semiconductor device, is recorded.

The production data is then correlated with particular semiconductor products 105 and particular manufacturing tools 110, 112, 114, as described in block 320 of FIG. 3. Data relating to quality of processed semiconductor products 105 can be extracted from the production data. A process controller, such as the APC, can access data relating to processed semiconductor products 105 and the manufacturing tool 110, 112, 114 in which they were processed. From the correlated production data, data corresponding to the quality of the processed semiconductor products 105 is acquired, as described in block 330 of FIG. 3. In other words, a process controller analyzes the production data and determines the quality level of the processed semiconductor products 105 and identifies the manufacturing tool 110, 112, 114 in which the semiconductor products 105 were processed.

Once the quality level of the processed semiconductor products 105 is acquired, the order of particular manufacturing tools utilized to process the semiconductor products 105 is analyzed, as described in block 340 of FIG. 3. Generally, certain combinations of processing tools 110, 112, 114 can produce higher quality semiconductor products 105, which can be illustrated by the following example. In photolithography overlay processes, lines are generally printed on a semiconductor wafer 105 on one layer over another. The registration is a measure of how well the printed lines are aligned. Proper alignment of the printed lines across multiple layers of the semiconductor wafer is important for proper operation of a semiconductor product 105. Ideally, all process steps required on a semiconductor wafer 105 would be performed on the same manufacturing tool 110, 112, 114. Even though manufacturing tools 110, 112, 114 tend to have inherent errors, all overlay lines printed on the semiconductor wafer 105 using the same manufacturing tool 110, 112, 114 should be aligned properly across multiple layers of the semiconductor wafer 105.

Generally, in high volume production of semiconductor products 105, it is inefficient to use one manufacturing tool for multiple processes on a single semiconductor wafer 105. Generally there are thousands of semiconductor wafers 105 that are simultaneously processed in a manufacturing area. Therefore, to attain greater efficiency, typically one manufacturing tool is dedicated for one particular manufacturing operation, instead of processing one particular semiconductor wafer 105. To achieve higher quality semiconductor products 105, certain combinations of manufacturing tools that have similar operating characteristics are determined.

Utilizing the methods taught by the present invention, one skilled in the art can ascertain which combinations of manufacturing tools 110, 112, 114 produce higher quality and more accurately processed semiconductor products 105. Turning back to FIG. 2, using the aforementioned techniques, optimal combination, of manufacturing tools 110, 112, 114 are determined, as described in block 220. Once at least one set of optimal combinations of manufacturing tools 110, 112, 114 is determined, a queuing system is implemented to obtain favorable combinations of manufacturing tools 110, 112, 114, as described in block 230 of FIG. 2.

Figure 4:
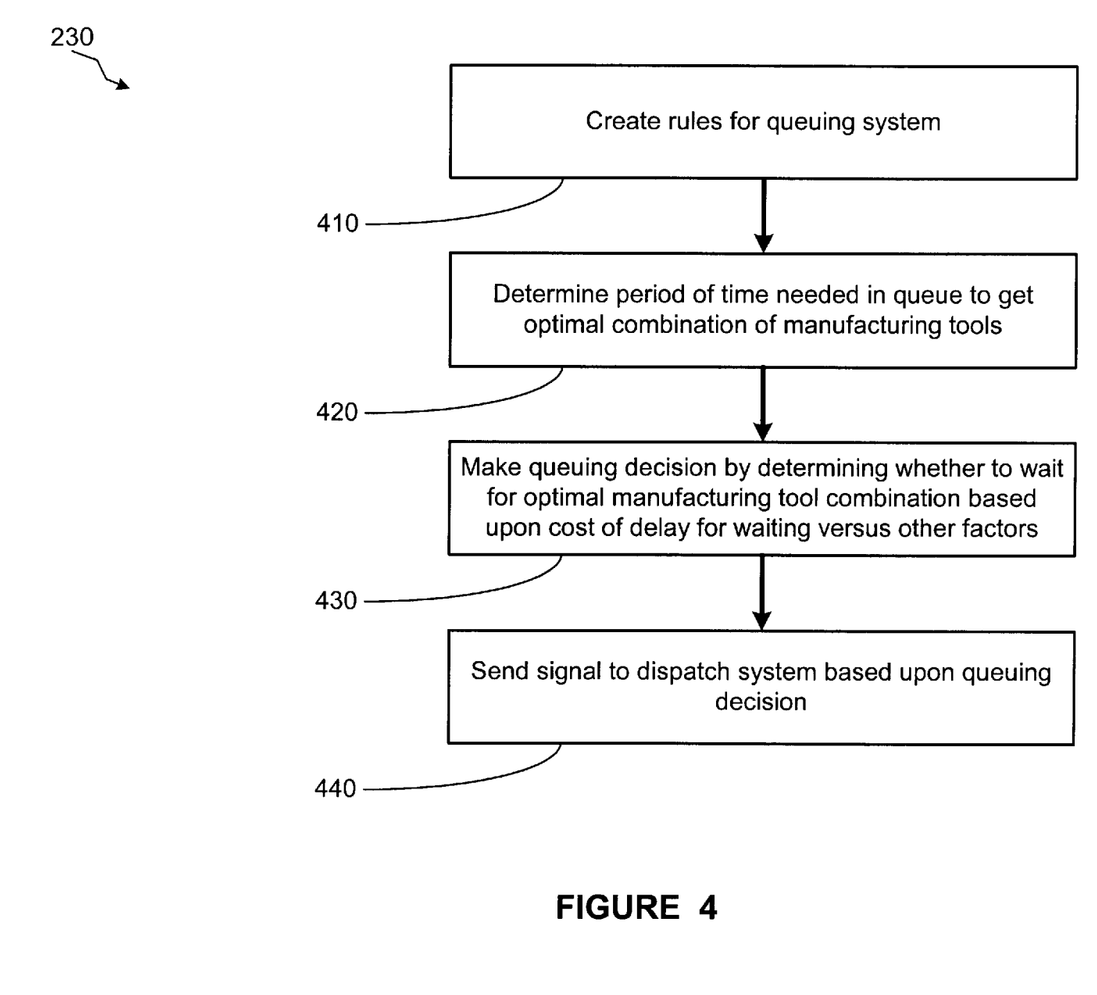
FIG. 4 illustrates in further detail, one embodiment of a queuing system implementation described in FIG. 2.

Turning now to FIG. 4, a flowchart representation of one method of implementing the queuing system is illustrated. A set of queuing rules is created for the queuing system, as described in block 410 of FIG. 4. In one embodiment, the queuing rules are used to make decisions regarding the routing of semiconductor products 105 throughout the manufacturing area. In one embodiment, queuing rules include choosing manufacturing tools 110, 112, 114 that produce the highest quality processed semiconductor products 105. In addition to quality considerations, queuing rules can also be created using factors such as factory-out dates, target finish dates, and profitability of particular semiconductor products 105.

In one example, a semiconductor wafer 105 that is in the midst of multiple overlay processes is processed in processing tool A 110 (see FIG. 1). The next process operation that is to be performed on the semiconductor wafer 105 can be finished in either processing tool B 112 or processing tool C 114. In one embodiment of the queuing rules, the decision to process the semiconductor wafer 105 in processing tool C 114 instead of processing tool B 112 may be based upon how different combinations of processing tools 110, 112, 114 operate. Using the principles described above, a determination may be made that the combination of processing tool A 110 paired with processing tool C 114 is a better process combination than the combinations of processing tool A 110 paired with processing tool B 112, and processing tool B 112 paired with processing tool C 114.

In one embodiment of the queuing rules, a protocol may dictate that when a process operation is required on a semiconductor wafer 105, manufacturing tools 110, 112, 114 that are idle are identified. At this point there may be a subset of manufacturing tools 110, 112, 114 that are eligible to perform the next process operation on the semiconductor wafer 105. The protocol directed by the queuing rule can then choose the manufacturing tool 110, 112, 114 that is the best combination with the manufacturing tool 110, 112, 114 that performed the previous process operation on the semiconductor wafer 105.

One step in implementing a queuing system is determining a period of time needed in queue awaiting an optimal combination of manufacturing tools 110, 112, 114 for processing, as described in block 420 of FIG. 4. In other words, when a particular semiconductor wafer 105 is awaiting a process step, instead of simply processing the semiconductor wafer 105 in the next available manufacturing tool 110, 112, 114, a certain amount of time may be required to wait for the availability of the manufacturing tool 110, 112, 114 that is an optimal combination with the manufacturing tool 110, 112, 114 that performed the previous process on the semiconductor wafer 105. The time needed to wait for the availability of a manufacturing tool that is an optimal combination with the manufacturing tool 110, 112, 114 used in the previous process of a particular semiconductor wafer 105 is the cost of quality benefits attained by using favorable manufacturing tool combinations. The time spent waiting for an optimal manufacturing tool combination can reduce production of semiconductor wafers 105.

Once the period to time required for optimal tool combination is determined, a queuing decision is made whether to wait for the optimal manufacturing tool combination, as described in block 430 of FIG. 4. In one embodiment, the queuing decision is made based upon the cost of delay for waiting versus other factors such as factory-out dates, target finish dates, and profitability of particular semiconductor wafers 105. Waiting for the manufacturing tool 110, 112, 114 that provides the optimal combination when paired with the manufacturing tool 110, 112, 114 that performed the previous process can be costly. Particularly when there is another batch (or run) of semiconductor wafers 105 being held in queue. If there is a significant delay in waiting for the optimal combination of manufacturing tools, particularly when other batches of semiconductor wafers 105 are waiting in queue, a decision to forgo some of the accuracy gained by waiting for the optimal combination may by made. Often, the highest accuracy during semiconductor processing may not be cost effective if processing with lower accuracy would result in semiconductor wafers 105 that are still within acceptable tolerance levels.

Furthermore, some batches of semiconductor wafers 105 may have a faster factory-out date associated with them, which indicates that being held in queue awaiting an optimal manufacturing tool combination may not be desirable. Some batches of semiconductor wafers 105 may have a particular target finish date such that its priority may prompt a queuing decision to not wait for an optimal combination of manufacturing tools. Other technical, business, and economical factors may affect queuing decisions.

Once a queuing decision is made, a feedback signal is sent to a process control system, such as the APC, and the dispatch system 140 is directed according to the queuing decision, as described in block 440 of FIG. 4. At this point, the step of implementing the queuing system to obtain favorable combinations of manufacturing tools, which is described in block 230 of FIG. 2, is substantially complete. Once the queuing system is implemented, the dispatch system 140 is deployed to carry out the routing of semiconductor wafers 105, according to the protocol established by the queuing system. Using the aforementioned steps of acquiring semiconductor wafer quality data and implementing a queuing system based on the quality data, effectively integrates a quality database with a semiconductor wafer routing system. In other words, a process control system, such as the APC, can be integrated with a quality database and a semiconductor wafer routing system to achieve efficient, high quality processed semiconductor wafers 105.

The principles taught by the present invention can be implemented in an Advanced Process Control (APC) Framework. The APC is a preferred platform from which to implement the overlay control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system.

The semiconductor device quality database can be integrated with the APC and the dispatch system 140 to carry out routing of semiconductor wafers 105 as prescribed by the queuing system. In one embodiment, the dispatch system 140 can be independent such that it can interface with multiple types of process control systems. The dispatch system 140 can receive commands from one or more types of control systems and route semiconductor wafers 105 to appropriate manufacturing areas. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention.

Accordingly, the protection sought herein is as set forth in the claims below.

What is claimed:

1. A method for automatic routing of semiconductor devices within a manufacturing area, comprising:
    tracking performance of a plurality of manufacturing tools while processing semiconductor devices;
    determining at least one optimal combination of said manufacturing tools based upon said tracked performance of said manufacturing tools;
    implementing a queuing system to attain said optimal combination of said manufacturing tools; and
    deploying a dispatch system in response to said queuing system for routing said semiconductor devices within said manufacturing area.

2. The method described in claim 1 wherein tracking performance of a plurality of manufacturing tools while processing semiconductor devices further comprises:
    recording production data relating to said semiconductor device being processed;
    correlating said recorded production data with specific semiconductor device;
    correlating said recorded production data with specific manufacturing tools;
    acquiring data relating to quality of said processed semiconductor devices using said production data correlated with specific semiconductor device; and
    analyzing order of operation of said manufacturing tools using said acquired data relating to quality.

3. The method described in claim 2, wherein processing semiconductor devices further comprises processing semiconductor wafers.

4. The method described in claim 3, wherein processing semiconductor wafers further comprises processing semiconductor wafers using an exposure tool.

5. The method described in claim 4, wherein processing semiconductor wafer using said exposure tool further comprises using an advanced process control framework.

6. The method described in claim 2, wherein recording production data relating to said semiconductor device being processed further comprises storing said production data into an electronic media such that a process controller is capable of retrieving said production data.

7. The method described in claim 2, wherein analyzing order of operation of said manufacturing tools using said acquired data relating to quality further comprises determining which order of operation of said manufacturing tools produced the highest quality semiconductor device.

8. The method described in claim 1, wherein determining at least one optimal combination of said manufacturing tools further comprises matching a first manufacturing tool that operates in a similar fashion as that of a second manufacturing tool.

9. The method described in claim 8, wherein matching a first manufacturing tool that operates in a similar fashion as that of a second manufacturing tool further comprises matching a first manufacturing tool that contains similar registration qualities as that of said second manufacturing tool.

10. The method described in claim 1, wherein implementing a queuing system to attain said optimal combination of said manufacturing tools further comprises:
    creating queuing rules for said queuing system;
    determining a period of time needed in queue to attain optimal combination of said manufacturing tools;
    making a queuing decision based on said period of time needed in queue to attain optimal combination of said manufacturing tools; and
    sending a feedback signal to a process controller to control said dispatch system, based upon said queuing decision.

11. The method described in claim 10, wherein creating queuing rules for said queuing system further comprises selecting said combination of said manufacturing tools that produce the highest quality semiconductor devices.

12. The method described in claim 10, wherein determining a period of time needed in queue to attain optimal combination of said manufacturing tools further comprises determining a waiting time period required until a subsequent manufacturing tool that is an optimal combination with a previous manufacturing tool is available.

13. The method described in claim 10, wherein making a queuing decision further comprises making a queuing decision to wait until a subsequent manufacturing tool that is an optimal combination with a previous manufacturing tool is available.

14. The method described in claim 1, wherein deploying a dispatch system further comprises integrating a process controller with said production data and said dispatch system.

15. The method described in claim 14, wherein integrating a process controller with said production data and said dispatch system further comprises integrating an advanced process controller with said production data and said dispatch system.

16. An apparatus for automatic routing of semiconductor devices within a manufacturing area, comprising:

means for tracking performance of a plurality of manufacturing tools while processing semiconductor devices;

means for determining at least one optimal combination of said manufacturing tools based upon said tracked performance of said manufacturing tools;

means for implementing a queuing system to attain said optimal combination of said manufacturing tools; and means for deploying a dispatch system in response to said queuing system for routing said semiconductor devices within said manufacturing area.

17. A computer readable program storage device encoded with instructions that, when executed by a computer, performs a method for automatic routing of semiconductor devices within a manufacturing area, comprising:

tracking performance of a plurality of manufacturing tools while processing semiconductor devices;

determining at least one optimal combination of said manufacturing tools based upon said tracked performance of said manufacturing tools;

implementing a queuing system to attain said optimal combination of said manufacturing tools; and deploying a dispatch system in response to said queuing system for routing said semiconductor devices within said manufacturing area.

18. The computer readable program storage device encoded with instructions that, when executed by a computer, performs the method described in claim 17, wherein tracking performance of a plurality of manufacturing tools while processing semiconductor devices further comprises:

recording production data relating to said semiconductor device being processed;

correlating said recorded production data with specific semiconductor device;

correlating said recorded production data with specific manufacturing tools;

acquiring data relating to quality of said processed semiconductor devices using said production data correlated with specific semiconductor device; and analyzing order of operation of said manufacturing tools using said acquired data relating to quality.

19. The computer readable program storage device encoded with instructions that, when executed by a computer, performs the method described in claim 18, wherein processing semiconductor devices further comprises processing semiconductor wafers.

20. The computer readable program storage device encoded with instructions that, when executed by a computer, performs the method described in claim 19, wherein processing semiconductor wafers further comprises processing semiconductor wafers using an exposure tool.

21. The computer readable program storage device encoded with instructions that, when executed by a computer, performs the method described in claim 20, wherein processing semiconductor wafer using said exposure tool further comprises using an advanced process control framework.

22. The computer readable program storage device encoded with instructions that, when executed by a computer, performs the method described in claim 18, wherein recording production data relating to said semiconductor device being processed further comprises storing said production data into an electronic media such that a process controller is capable of retrieving said production data.

23. The computer readable program storage device encoded with instructions that, when executed by a computer, performs the method described in claim 18, wherein analyzing order of operation of said manufacturing tools using said acquired data relating to quality further comprises determining which order of operation of said manufacturing tools produced the highest quality semiconductor device.

24. The computer readable program storage device encoded with instructions that, when executed by a computer, performs the method described in claim 17, wherein determining at least one optimal combination of said manufacturing tools further comprises matching a first manufacturing tool that operates in a similar fashion as that of a second manufacturing tool.

25. The computer readable program storage device encoded with instructions that, when executed by a computer, performs the method described in claim 24, wherein matching a first manufacturing tool that operates in a similar fashion as that of a second manufacturing tool further comprises matching a first manufacturing tool that contains similar registration qualities as that of said second manufacturing tool.

26. The computer readable program storage device encoded with instructions that, when executed by a computer, performs the method described in claim 17, wherein implementing a queuing system to attain said optimal combination of said manufacturing tools further comprises:

creating queuing rules for said queuing system;

determining a period of time needed in queue to attain optimal combination of said manufacturing tools;

making a queuing decision based on said period of time needed in queue to attain optimal combination of said manufacturing tools; and sending a feedback signal to a process controller to control said dispatch system, based upon said queuing decision.

27. The computer readable program storage device encoded with instructions that, when executed by a computer, performs the method described in claim 26, wherein creating queuing rules for said queuing system further comprises selecting said combination of said manufacturing tools that produce the highest quality semiconductor devices.

28. The computer readable program storage device encoded with instructions that, when executed by a computer, performs the method described in claim 26, wherein determining a period of time needed in queue to attain optimal combination of said manufacturing tools further comprises determining a waiting time period required until a subsequent manufacturing tool that is an optimal combination with a previous manufacturing tool is available.

29. The computer readable program storage device encoded with instructions that, when executed by a computer, performs the method described in claim 26, wherein making a queuing decision further comprises making a queuing decision to wait until a subsequent manufacturing tool that is an optimal combination with a previous manufacturing tool is available.

30. The computer readable program storage device encoded with instructions that, when executed by a computer, performs the method described in claim 17, wherein deploying a dispatch system further comprises integrating a process controller with said production data and said dispatch system.

31. The computer readable program storage device encoded with instructions that, when executed by a computer, performs the method described in claim 30, wherein integrating a process controller with said production data and said dispatch system further comprises integrating an advanced process controller with said production data and said dispatch system.

* * * * *